(12) United States Patent
Mouhoubi et al.

(10) Patent No.: US 9,768,247 B1
(45) Date of Patent: Sep. 19, 2017

(54) SEMICONDUCTOR DEVICE HAVING IMPROVED SUPERJUNCTION TRENCH STRUCTURE AND METHOD OF MANUFACTURE

(71) Applicant: SEMICONDUCTOR COMPONENTS INDUSTRIES, LLC, Phoenix, AZ (US)

(72) Inventors: Samir Mouhoubi, Oudenaarde (BE); Joris Baele, Ghent (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/148,170

(22) Filed: May 6, 2016

(51) Int. Cl.
| | | |
|---|---|---|
| *H01L 29/06* | (2006.01) | |
| *H01L 29/78* | (2006.01) | |
| *H01L 29/40* | (2006.01) | |
| *H01L 29/10* | (2006.01) | |
| *H01L 29/66* | (2006.01) | |

(52) U.S. Cl.
CPC ...... *H01L 29/0634* (2013.01); *H01L 29/1095* (2013.01); *H01L 29/407* (2013.01); *H01L 29/66734* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 5,572,048 A | 11/1996 | Sugawara | |
| 6,465,863 B1 | 10/2002 | Deboy et al. | |
| 6,479,876 B1 | 11/2002 | Deboy et al. | |
| 6,633,064 B2 | 10/2003 | Auebach et al. | |
| 6,768,170 B2 | 7/2004 | Zhou | |
| 6,828,609 B2 | 12/2004 | Deboy et al. | |
| 7,176,524 B2 | 2/2007 | Loechelt et al. | |
| 7,253,477 B2 | 8/2007 | Loechelt et al. | |
| 7,285,823 B2 | 10/2007 | Loechelt et al. | |
| 7,372,111 B2 | 5/2008 | Onishi et al. | |

(Continued)

OTHER PUBLICATIONS

"A Novel Trench Concept for the Fabrication of Compensation Devices," M. Rub, D. Ahlers, J. Baumgartl, G. Deboy, W. Friza, O. Haberlen and Steinigke, pp. 203-206., ISPSD Apr. 14-17, 2003 Cambridge, UK. (enclosed).

(Continued)

*Primary Examiner* — Charles Garber
*Assistant Examiner* — Alia Sabur
(74) *Attorney, Agent, or Firm* — Kevin B. Jackson

(57) ABSTRACT

A semiconductor device includes a charge-compensating region with a first structure disposed adjoining an end portion of the charge-compensating region. The first structure is configured to reduce charge-imbalances present in the charge-compensating region. In one embodiment, the first structure includes a trench that extends along the vertical depth of the charge-compensated trench so that the final charge-compensating region is provided without corner portions. In one embodiment, a material, such as a dielectric material and/or a polycrystalline semiconductor material, may be disposed within the trench and at least along the end portion of the charge-compensating region. Among other things, the first structure improves device electrical performance and manufacturing yields.

20 Claims, 6 Drawing Sheets

(56) References Cited

U.S. PATENT DOCUMENTS

| | | |
|---|---|---|
| 7,411,266 B2 | 8/2008 | Tu et al. |
| 7,423,316 B2 | 9/2008 | Kawaji et al. |
| 7,482,220 B2 | 1/2009 | Loechelt et al. |
| 7,696,600 B2 | 4/2010 | Mauder et al. |
| 7,902,075 B2 | 3/2011 | Grivna et al. |
| 7,902,601 B2 | 3/2011 | Loechelt et al. |
| 7,960,781 B2 | 6/2011 | Loechelt et al. |
| 7,989,885 B2 | 8/2011 | Hirler et al. |
| 8,106,436 B2 | 1/2012 | Grivna et al. |
| 8,372,716 B2 | 2/2013 | Loechelt et al. |
| 8,389,369 B2 | 3/2013 | Loechelt |
| 9,219,138 B2 | 12/2015 | Roig-Guitart et al. |
| 2003/0209750 A1 | 11/2003 | Deboy et al. |
| 2008/0128798 A1 | 6/2008 | Schulze et al. |
| 2010/0059814 A1 | 3/2010 | Loechelt et al. |
| 2010/0059815 A1 | 3/2010 | Grivna et al. |
| 2010/0187604 A1 | 7/2010 | Ono et al. |
| 2010/0317158 A1 | 12/2010 | Yilmaz et al. |
| 2011/0156682 A1 | 6/2011 | Girdhar et al. |
| 2012/0187527 A1 | 7/2012 | Guitart et al. |
| 2012/0273875 A1 | 11/2012 | Yedinak et al. |
| 2013/0015493 A1 | 1/2013 | Senoo |
| 2014/0048847 A1 | 2/2014 | Yamashita et al. |
| 2014/0097489 A1* | 4/2014 | Roig-Guitart ....... H01L 29/0646 257/330 |
| 2014/0327070 A1* | 11/2014 | Hirler .................. H01L 29/063 257/329 |

OTHER PUBLICATIONS

Syotaro Ono, et al., Design concept of n-buffer layer (n-Bottom Assist Layer for 600V-class Semi-Super Junction MOSFET, Proceedings of the 19th International Symposium on Power Semiconductor Devices & ICs, May 27-30, 2007 JeJu, Korea.

Hideharu Egawa, Avalanche Characteristics of Failure Mechanism of High Voltage Diodes, IEEE Xplore, Transactions on Electron Devices, vol. ED-13, Nov. 1966.

Wataru Saito, et al, A 20m0cm2 600 V-class Superjunction MOSFET, Proceedings of 2004 International Symposium on Power Semiconductor Devices & ICs, Kitayushu, pp. 459-462.

* cited by examiner

SEMICONDUCTOR DEVICE HAVING IMPROVED SUPERJUNCTION TRENCH STRUCTURE AND METHOD OF MANUFACTURE

CROSS-REFERENCE TO RELATED APPLICATIONS

Not Applicable.

BACKGROUND

The present invention relates, in general, to electronics and, more particularly, to semiconductor device structures and methods of manufacture.

Metal-oxide semiconductor field effect transistors (MOSFETs) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source region and the drain region.

Today's higher voltage power switch market is driven by at least two major parameters, which include breakdown voltage (BVdss) and on-state resistance (Rdson). For a specific application, a minimum breakdown voltage is required, and in practice, designers typically can meet a BVdss specification. However, this is often at the expense of Rdson. This trade-off in performance is a major design challenge for manufacturers and users of high voltage power switching devices.

Recently, superjunction devices have gained in popularity to improve the trade-off between Rdson and BVdss. In previous n-channel superjunction devices, multiple heavily-doped diffused n-type and p-type regions replace one lightly doped n-type epitaxial region. In the on state, current flows through the heavily doped n-type regions, which lowers Rdson. In the off or blocking state, the heavily doped n-type and p-type regions deplete into or compensate each other to provide a high BVdss. More recently, price points for superjunction devices have become more attractive and market trends are driving demand for lower conduction and switching losses. Additional factors driving demands for superjunction devices include increased power conversion efficiency, increased power density requirements, smaller package requirements with demand for better performance, adoption of surface mount packages, and reductions in heat sinking requirements.

Certain previous superjunction technologies are based on a local charge balanced (LCB) concept. By way of example, in LCB devices superjunction trenches can be formed by reactive ion etching in the active area of a semiconductor substrate and then lined with as-formed heavily-doped n-type and p-type layers. In one embodiment, an n-type layer is formed first, and then a p-type layer is formed thereafter. Typically, both the n-type and p-type doping is uniform along the entire superjunction trench depth. Thus, because there is no imbalance along the superjunction trench depth the electric field is therefore uniform for optimum charge balance and highest breakdown voltage.

Although superjunction devices are achieving broader acceptance, significant challenges still exist in manufacturing them. For example, one problem with previous superjunction devices including LCB superjunction devices is that the trench structures have been found to create strong charge imbalances in certain trench structure locations. These strong charge imbalances have been found to decrease BVdss and to reduce unclamped inductive switching (UIS) performance. These issues further reduce manufacturing yields thereby increasing superjunction die costs.

Accordingly, it is desirable to have superjunction structure and method that overcomes the performance, yield, and manufacturing issues noted above as well as others. Additionally, it would be beneficial for the structure and method to be more robust against typical manufacturing process variations, such as trench depths, trench widths, and layer doping concentrations, among others.

Figure 1:
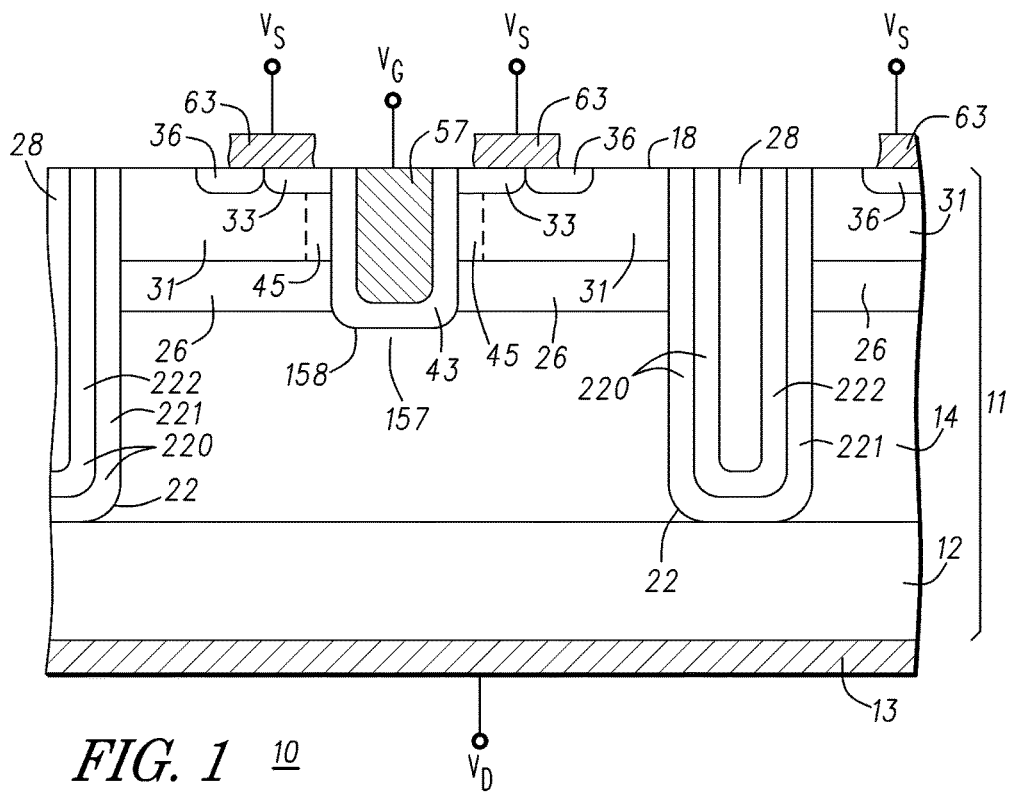
FIG. 1 illustrates an enlarged partial cross-sectional view of semiconductor device in accordance with an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a semiconductor device having a charge-compensated region that has a tip portion replaced with a structure configured to reduce charge imbalance in the semiconductor device. In one embodiment, the structure includes a trench that is disposed to replace the tip portion and extends the depth of the charge-compensated trench structure. In some embodiments, a material configured not to disturb the charge balance within the semiconductor device is disposed within the trench. In some embodiments, the material includes one or more dielectric materials. In other embodiments, the material includes a polycrystalline semiconductor material. The structure was found in practice to improve breakdown voltage (BVdss) and unclamped inductive switching (UIS) performance and robustness of the semiconductor device, and to further improve manufacturing yields compared to related devices.

More particularly, in one embodiment a semiconductor device comprises a region of semiconductor material having a major surface and formed with a charge-compensated trench structure extending from the major surface into the region of semiconductor material to a first depth, wherein the charge-compensated trench structure includes a conduction layer of a first conductivity type semiconductor material and a compensation layer of a second conductivity type semiconductor material, and wherein the second conductivity type is opposite to the first conductivity type. A first trench structure is disposed adjoining a first end portion of the charge-compensated trench structure. The first trench structure comprises a first trench extending from the major surface to a second depth equal to or greater than the first depth and a material disposed within the first trench configured to reduce charge-imbalance in the charge-compensated trench structure. A body region of the second conductivity type is disposed in the region of semiconductor material adjacent to the charge-compensated trench structure. A source region of the first conductivity type is disposed adjacent the body region and a control structure is disposed adjacent the source region and the body region. The control structure is configured to control a channel region within the body region.

In another embodiment, a semiconductor device comprises a region of semiconductor material having a major surface. A first region extends from the major surface into the region of semiconductor material to a first depth and comprises a first compensation layer having a first conductivity type. A second region extends from the major surface into the region of semiconductor material to the first depth and comprises a second compensation layer having the first conductivity type. A first trench structure is disposed adjoining a first end portion of the first region, wherein the first trench structure comprises a first trench extending from the major surface to a second depth equal to or greater than the first depth and a first material is within the first trench. A second trench structure is disposed adjoining a second end portion of the second region. The second trench structure comprises a second trench extending from the major surface to the second depth and a second material is within the first trench. A body region of the first conductivity type is disposed in the region of semiconductor material between the first region and the second region. A source region of a second conductivity type opposite to the first conductivity type is disposed adjacent the body region, and a control structure is disposed adjacent the source and body regions, which is configured to control a channel region within the body region.

In a further embodiment, a method for forming a semiconductor device comprises providing a region of semiconductor material having a major surface and a charge-compensated trench structure extending from the major surface into the region of semiconductor material to a first depth. The charge-compensated trench structure includes a conduction layer of a first conductivity type semiconductor material and a compensation layer of a second conductivity type semiconductor material, which is opposite to the first conductivity type. The charge-compensated trench structure includes a first tip portion having a least one corner portion. The method includes providing a first trench within the region of semiconductor material by removing the tip portion of the charge-compensated trench structure such that the first trench adjoins the charge-compensated trench structure along the first depth. The method includes providing a material within the first trench configured to reduce charge imbalance in the charge-compensated trench structure. The method includes providing a body region of the second conductivity type in the region of semiconductor material adjacent to the charge-compensated trench structure. The method includes providing a source region of the first conductivity type adjacent the body region. The method includes providing a control structure adjacent the source region and the body region, wherein the control structure is configured to control a channel region within the body region.

Figure 2:
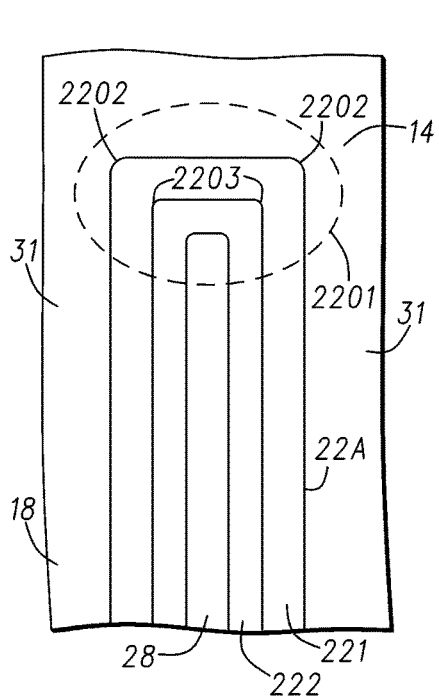
FIG. 2 shows a partial top view of a charge-compensated trench structure in accordance with a related device.
Figure 3:
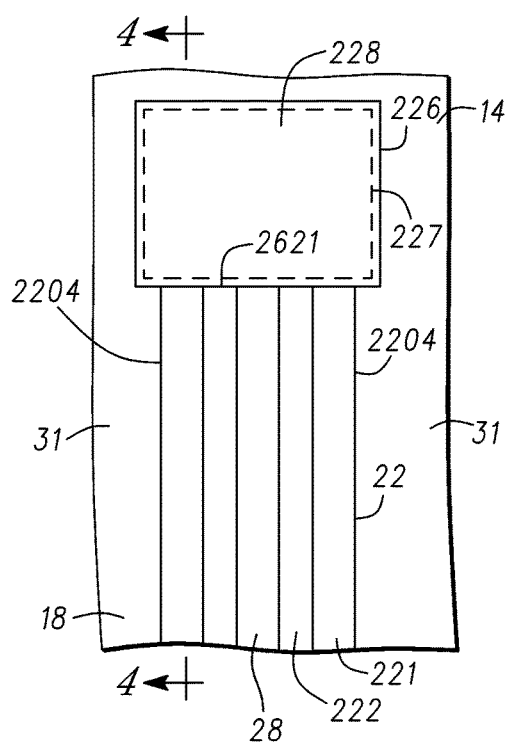
FIG. 3 illustrates a partial top view of a charge-compensated trench structure in accordance with an embodiment of the present invention.

FIG. 1 illustrates a partial cross-sectional view of a device 10, such as a semiconductor device 10, an insulated gate field effect transistor (IGFET) 10, MOSFET 10, LCB superjunction device 10, superjunction structure 10, or switching device or cell 10. FIG. 2 illustrates a partial top view of a charge-compensated trench structure 22A in accordance with a related structure. FIG. 3 illustrates a partial top view of a charge-compensated trench structure 22 in accordance with a first embodiment configured to address the issues with related superjunction devices as described previously.

With reference to FIG. 1, semiconductor device 10 can be among many such devices integrated with logic and/or other components into a semiconductor chip as part of a power integrated circuit. Alternatively, semiconductor device 10 is among many such devices integrated together to form a discrete transistor device.

Semiconductor device 10 includes a region of semiconductor material 11 or body of semiconductor material 11, which comprises for example, an n-type silicon substrate 12 having a resistivity in a range of approximately 0.001 to about 0.01 ohm-cm, and may be doped with arsenic or phosphorous. In the embodiment illustrated, substrate 12 provides a drain region or a first current carrying electrode for semiconductor device 10, which is disposed adjacent to a conductive layer 13. A semiconductor layer 14 is formed in, on, or overlying substrate 12 and can be n-type and doped light enough in one embodiment so as to not impact the charge balance within the trench compensation regions described later. In one embodiment, layer 14 is formed using epitaxial growth techniques. In an embodiment suitable for a 650 volt device, layer 14 is doped n-type with a dopant concentration of about $1.0 \times 10^{13}$ atoms/cm$^3$ to about $5.0 \times 10^{14}$ atoms/cm$^3$, and has a thickness in a range from of about 40 microns to about 70 microns. Note that, although semiconductor layer 14 is shown as thicker than substrate 12 in the drawings, substrate 12 can be thicker. It is shown this way for ease of understanding in the drawings. The thickness of layer 14 is increased or decreased depending on, for example, the desired BVdss rating of device 10. Additionally, those skilled in the art will understand that an insulated gate bipolar transistor (IGBT) device is achieved with the present structure by, for example, changing the conductivity type of substrate 12 to p-type (i.e., opposite to semiconductor layer 14). In an optional embodiment, substrate 12 may further include an n+ type buffer layer disposed between substrate 12 and semiconductor layer 14.

Semiconductor device 10 further includes spaced apart regions 22, superjunction regions 22, superjunction structures 22, compensating trenches 22, compensating regions 22, compensated regions 22, compensated trenches 22, charge-compensating trenches 22, charge-compensating regions 22, charge compensating trench structure 22, semiconductor material containing trenches 22, charge-compensated trench structures 22, LCB regions 22, LCB structures 22, charge-compensated filled trenches 22, compensation trenches 22, localized vertical charge compensation structures 22, or LCB regions or pillars 22. As used herein, charge compensation generally means that the total charge of the opposite conductivity type layers is substantially or generally balanced or equal, or is set to a predetermined or desired imbalance. In one embodiment, charge-compensated filled trenches 22 can include a plurality of layers or multiple pillars of material, conductive material or semiconductor material 220, including at least two layers, structures, or pillars of opposite conductivity type (i.e., at least one each of n-type and p-type), which may be separated by an intrinsic, buffer, or lightly doped semiconductor layer or layers. As illustrated in FIG. 1, in one embodiment material 220 includes a pillar or layer 221 of n-type semiconductor material adjoining semiconductor layer 14 along sidewall surfaces of the trenches.

In accordance with one embodiment, layers 221 are of the same conductivity type as source regions 33, and form a primary vertical low resistance current path from the channel to the drain when semiconductor device 10 is in the on-state. In one embodiment, layer 221 can be referred to a conduction layer or vertically oriented conduction layer. A layer 222 of compensating p-type semiconductor material is formed overlying layer 221. By way of example, n-type layers 221 and p-type layers 222 can have a dopant concentration on the order of about $1.0 \times 10^{15}$ atoms/cm$^3$ to about $1.0 \times 10^{17}$ atoms/cm$^3$, and each can have a thickness of about 0.1 microns to about 0.4 microns. Depending on the desired charge balance, the foregoing dopant concentrations are increased or decreased accordingly. In one embodiment, layer 222 can be referred to as a compensation layer, compensating layer, or vertically oriented compensation layer. When semiconductor device 10 is in an off state, p-type layers 222 and n-type layers 221 compensate each other to provide an increased BVdss characteristic. Although no intrinsic or buffer layers are shown in the device of FIG. 1, it is understood that they may be present in earlier steps in fabrication and may not be as evident because dopant can diffuse into such layers during subsequent high temperature processing. In one embodiment, layers of semiconductor material 220 comprise a single crystalline semiconductor material and have as-formed dopant profiles.

In one embodiment, semiconductor device 10 also includes one or more dielectric layers 28, a dielectric plug 28, or a dielectric liner 28 formed overlying pillars 220 within charge-compensated filled trenches 22. In one embodiment, dielectric layer 28 is a deposited silicon oxide layer. In one embodiment, dielectric layer 28 can be multiple dielectric layers deposited or formed at different steps and can be different materials. In other embodiments, element 28 may be a void(s) or an air gap(s). Although not shown, it is understood that during the formation of semiconductor device 10, n-type dopant from highly doped substrate 12 can diffuse into the lower portions of charge-compensated filled trenches 22 so that those portions of charge-compensated filled trenches 22 within substrate 12 become more heavily doped n-type. When the optional n+ type buffer layer is used in conjunction with substrate 12, charge-compensated filled trenches 22 preferably extend into the n+ type buffer layer.

Semiconductor device 10 also includes a well 31, base 31, body or doped regions 31 disposed in semiconductor layer 14 between and in proximity to, adjacent to, or adjoining charge-compensated filled trenches 22. In one embodiment, body regions 31 extend from major surface 18 of semiconductor material 11 into semiconductor layer 14. In one embodiment, body regions 31 have a p-type conductivity, and have a dopant concentration suitable for forming an inversion layer that operates as conduction channels 45 of semiconductor device 10. In some embodiments, body regions 31 extend from major surface 18 to a depth of about 1.0 to about 5.0 microns. Those skilled in the art will appreciate that body region 31 may comprise a plurality of individually diffused regions, or comprise a connected, single or commonly diffused region of selected shape, or can comprise combinations thereof.

N-type source regions 33 are disposed adjacent, within, above, or in body regions 31 and extend from major surface 18 into semiconductor layer 14 to a depth of about 0.2 microns to about 0.5 microns. In one embodiment, portions of major surface 18 can extend down and then outward (not shown) from the edges of source regions 33 so that contact is made to horizontal and vertical surfaces of source regions 33 by source contact layer 63. One or more p-type body contact regions 36 are disposed in at least a portion of each body region 31. Body contact regions 36 are configured to provide a lower contact resistance to body region 31, and to lower the sheet resistance of body regions 31 under source regions 33, which suppresses parasitic bipolar effects.

In one embodiment, semiconductor device 10 further includes a control structure 157, such as a trench gate structure 157 adjoining body regions 31 and source regions 33. In other embodiments, control structure 157 can be a planar gate structure. In some embodiments, control structure 157 is laterally spaced apart from adjacent charge-compensated filled trenches 22. That is, control structure 157 does not overlie charge-compensated trench 22. In one embodiment, trench gate structure 157 includes a gate trench 158 and a gate dielectric layer 43 formed overlying surfaces of gate trench 158. In one embodiment, gate dielectric layer 43 comprises a silicon oxide, and has a thickness of about 0.05 microns to about 0.1 microns. In another embodiment, gate dielectric layer 43 has a thickness at the lower surfaces of gate trench 158 that is greater or thicker than the thickness of gate dielectric layer 43 along the sidewalls of gate trench 158. In alternative embodiments, gate dielectric layer 43 comprises silicon nitride, tantalum pentoxide, titanium dioxide, barium strontium titanate, or combinations thereof including combinations with silicon oxide, or the like.

Trench gate structure 157 further includes a conductive gate region 57 disposed within gate trench 158 and overlies gate dielectric layer 43. In one embodiment, source region 33 can be interposed between conductive gate region 57 and a charge-compensated trench structure 22. Conductive gate region 57 comprises, for example, n-type polysilicon. Although conductive gate region 57 is shown as substantially co-planar with major surface 18, conductive gate region 57 may extend higher or above major surface 18 or may be recessed below major surface 18. Trench gate structure 157 is configured to control the formation of channels 45 and the conduction of current in semiconductor device 10.

To facilitate a sub-surface current path, semiconductor device 10 can further include n-type link 26, n-type doped layer(s) 26, or sub-surface doped layer(s) 26. Specifically, doped layers 26 are configured to provide a sub-surface conduction path (i.e., horizontally-oriented conduction or current path) between the drain ends of channels 45 and conduction layers 221, which are the primary conduction layers or vertical conduction or current paths in charge-compensated filled trenches 22. That is, in semiconductor device 10 current flows vertically through channels 45, then horizontally through doped layers 26, and then vertically through layers 221. Doped layers 26 are configured so that current flow is isolated from major surface 18 by body regions 31 and body contact regions 36, which are opposite conductivity types (p-type) from doped layers 26 (n-type).

Source contact layer 63 (partially shown) is formed overlying major surface 18 and makes contact to both source regions 33 and body contact regions 36. Although shown as a partial layer, it is understood that source contact layer 63 can overlie major surface 18 and is isolated from gate electrode 57 by an interlayer dielectric structure (not shown). In one embodiment, source contact layer 63 comprises a titanium/titanium nitride barrier layer and an aluminum silicon alloy formed overlying the barrier layer, or other materials known to those of skill in the art. Drain contact layer 13 is formed overlying or adjacent to an opposing surface of semiconductor material 11, and comprises, for example, a solderable metal structure such as titanium-nickel-silver, chrome-nickel-gold, or other suitable materials as known to those of skill in the art.

The operation of semiconductor device 10 proceeds as follows. Assume that source terminal 63 is operating at a potential $V_S$ of zero volts, conductive gate regions 157 receive a control voltage $V_G$=5.0 volts, which is greater than the conduction threshold of semiconductor device 10, and drain terminal 13 operates at drain potential $V_D$=5.0 volts. The values of $V_G$ and $V_S$ cause body region 31 to invert adjacent conductive gate regions 157 to form vertical channels 45, which electrically connect source regions 33 to doped regions 26. A device current Id flows from drain terminal 13 and is routed through n-type pillars 221, doped layer 26, channels 45, source regions 33, to source terminal 63. Hence, current Id flows vertically through n-type pillars 221 to produce a low on-resistance, and horizontally through n-type links 26 keeping the current path isolated from major surface 18. In one embodiment, Id=1.0 amperes. To switch semiconductor device 10 to the off state, a control voltage $V_G$ of less than the conduction threshold of the device is applied to conductive gate regions 157 (e.g., $V_G$<5.0 volts). This removes channels 45 and Id no longer flows through semiconductor device 10. In the off state, n-type pillars 221 and p-type pillars 222 compensate each other as the depletion region from the primary blocking junction spreads, which enhances BVdss.

FIG. 2 shows a partial top view of a charge-compensated trench structure 22A in accordance with a related device to further illustrate issues associated with such related devices. More particularly, as shown in FIG. 2, charge-compensated trench structure 22A has a tip portion 2201 where charge-compensated trench structure 22A laterally terminates within semiconductor layer 14. It was determined in practice that the structure of charge-compensated trench structure 22A within tip portion 2201 un-expectantly created a strong and unwanted charge imbalance. It is believed that by its construction, tip portion 2201 tends to contain a large excess of n-type charge compared to the rest of charge-compensated trench structure 22A. It is contemplated that aspect ratios and growth rate differences can be factors that cause an increase in dopant concentrations along tip portion 2201 thereby resulting in the unwanted charge imbalance.

This resultant charge imbalance was found to decrease BVdss and to reduce UIS energy capability. Furthermore, the on-state resistance could not be lowered to a more optimal value because any increase in the n-type doping concentration would result in an accentuated charge imbalance between the tip portion 2201 and the rest of the structure thus resulting in a much lower BVdss. It was further determined that the issues caused by tip portion 2201 not only impacted device performance, but they also resulted in a reduction in manufacturing yields. More particularly, natural process variations (and more specifically the variation of the n-type and p-type charge in the trench) are magnified proximate to or within tip portion 2201 leading to a significant reduction in the number of devices per wafer meeting required specifications thereby increasing die costs.

Figure 4:
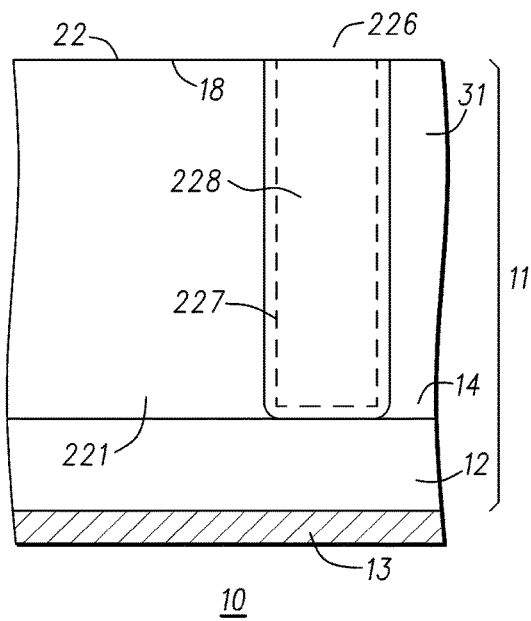
FIG. 4 illustrates a partial cross-sectional view of the embodiment of FIG. 3 taken along reference line 4-4 illustrated in FIG. 3.

FIG. 3 illustrates a partial top view of charge-compensated trench structure 22 in accordance with a first embodiment adapted to provide improved BVdss and UIS performance as well as to provide improved manufacturing yields. FIG. 4 illustrates a partial cross-sectional view of charge-compensated trench structure 22 taken along reference line 4-4 in FIG. 4. In accordance with the present embodiment, tip portion 2201 or end portion 2201 having corner regions 2202 and 2203 is removed after charge-compensated trench structure 22 is formed and replaced with a structure 226. In one embodiment, structure 226 comprises a pocket, recess, slot, slit, notch, channel, void or trench disposed along the vertical depth of charge-compensated trench structure 22 where tip portion 2201 would be located in the absence of structure 226.

In accordance with the present embodiment, structure 226 can be lined or filled with one or more materials configured so as to not disturb or impact the charge balance of charge-compensated trench structure 22. In one embodiment, structure 226 is lined with a material 227 or liner 227 (represented with a dashed line) or in other embodiments is further filled with one or more fill materials to provide a filled region 228. In one preferred embodiment, structure 226 extends from major surface 18 into semiconductor layer 14 to the same or a greater depth than charge-compensated filled trenches 22. Examples of materials suitable for liner 227 or filled region 228 include undoped and/or lowly doped dielectric materials including, but not limited to, oxides, nitrides, intrinsic or lowly doped semiconductor materials and/or polycrystalline semiconductor materials, and/or combinations thereof, as well as other similar materials as known to those of skill in the art. Such materials can be disposed within structure 226 using deposition techniques, such as low-pressure chemical vapor deposition (LPCVD), plasma-enhanced CVD (PECVD), and/or growth techniques, such as epitaxial growth or thermal growth processes.

In accordance with the present embodiment, structure 226 is disposed within region of semiconductor material 11 so as to replace end portion 2201 of charge-compensated filled trenches 22. Stated another way, structure 226 abuts or adjoins an inner portion of charge-compensated filled trenches 22. In some embodiments, structures 226 intersect charge-compensated filled trenches 22 such that corner portions 2202 and 2203 associated with conduction layer 221 and compensating layer 222 within tip portion 2201 are removed or absent. Stated another way, in accordance with the present embodiment, semiconductor device 10 is provided with charge-compensated filled trenches 22 absent corner portions 2202 and 2203 of conduction layer 221 and compensating layer 222 respectively so as to improve or enhance the charge imbalance stability or robustness of semiconductor device 10. In some embodiments, the outer edges 2204 of charge-compensated filled trenches 22 are generally perpendicular or orthogonal to side portion 2621 of structure 262 as generally illustrated in FIGS. 3 and 4 when structure 262 has a square or rectangular shape. In other embodiments, outer edges 2204, opposing outer edges 2204, or outer edge segments 2204 of charge-compensated filled trenches 22 are generally straight lines in top view where outer edges 2204 meet or abut structure 262 when structure 262 has other than a square shape, such as a polygonal shape, a circular shape, other rounded shapes, and/or combinations thereof.

In some embodiments, the formation of structure 226 may proceed as follows. After charge-compensated trench structure 22 is formed and dielectric materials overlying major surface 18 are planarized, photolithographic and etch techniques may be used to form openings in the dielectric materials to expose tip portion 2201. Structure 226, such as a trench having a desired shape can then be etched into region of semiconductor material 11 to remove tip portion 2201 preferably along the entire depth of charge-compensated trench structure 22. By way of example, structure 226 can be formed using plasma etching techniques with a hydrogen bromide chemistry (for example, $HBr/HeO_2/NF_3$), a fluorocarbon chemistry, or a fluorinated chemistry (for example, $SF_6/O_2$). The etched structure can then be lined or filled with one or more materials as described previously. In one embodiment, the material may be planarized using, for example, chemical mechanical planarization (CMP) techniques. Semiconductor device 10 may then be processed to completion.

Figure 5:
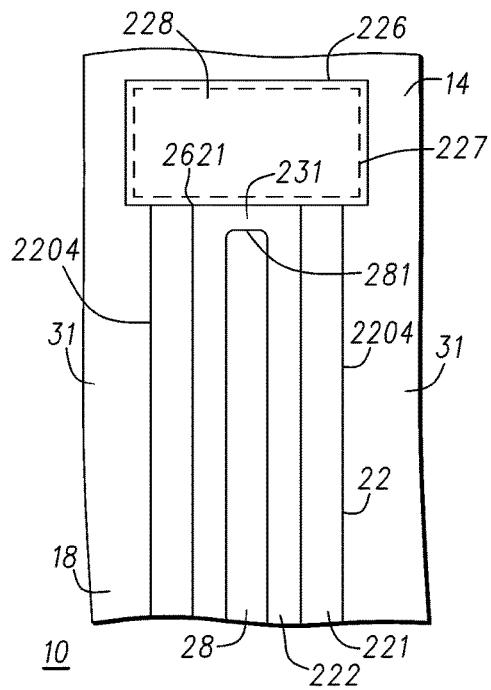
FIG. 5 illustrates a partial top view of a charge-compensated trench structure in accordance with another embodiment of the present invention.

FIG. 5 illustrates a partial top view of charge-compensated trench structure 22 in accordance with another embodiment. In the present embodiment, structure 226 is disposed so as to provide a partial removal of tip portion 2201. More particularly, in one embodiment, structure 226 is laterally spaced apart from end 281 of dielectric layer 28 to provide a space 231 or gap 231 there between. In accordance with the present embodiment, the end or tip portions of doped regions 221 and 222 are removed and replaced with structure 226 while leaving tip 281 or end 281 of dielectric layer 28 in place. In accordance with the present embodiment, corner portions 2202 and 2203 are removed and replaced with structure 226.

Figure 6:
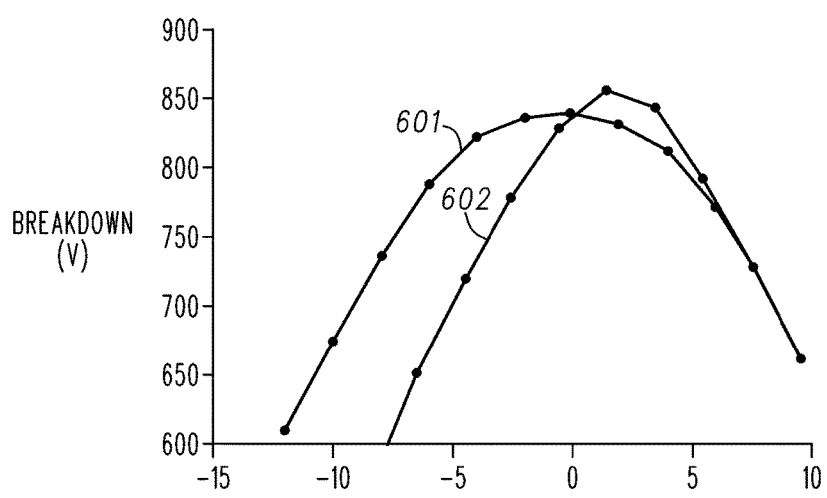
FIG. 6 illustrates graphical information of breakdown voltage as a function of charge imbalance comparing a device in accordance with the present invention with a related device.

FIG. 6 illustrates graphical information of breakdown voltage BVdss (volts) as a function of charge imbalance (Pimb (%)) comparing semiconductor device 10 with structures 226 (curve 601) to a device without structures 226 (curve 602), where Pimb is equal to 100*((Pconc.−Nconc.)/Nconc.). A positive Pimb reflects a more p-type rich structure while a negative Pimb reflects a more n-type rich structure. More particularly, the data of FIG. 6 illustrates the enhanced device performance that structures 226 provide by significantly improving the charge balance window of semiconductor device 10. Stated another way, with structures 226, the BVdss of device is more robust against minor variations in n-type and p-type doping and the resultant charge imbalance compared to the related device without structures 226.

In summary, structures 226 were found to improve the BVdss performance and the UIS performance of semiconductor device 10. Also, structures 226 were found to provide a structure less sensitive and thus more robust against typical manufacturing process variations, such as trench depths, trench widths, and layer doping concentrations, among others. Additionally, structures 226 were found to be more robust compared to other related approaches for compensating for charge imbalances, such as ion implantation of p-type dopant into the tip portions.

Turning now to FIGS. 7-12, various embodiments using structures 226 are described as further examples. In each embodiment, only regions 22 and structures 226 are illustrated so as to not over-complicate the illustrations. Those skilled in the art will understand that those regions (generally designated as element 246) between adjacent regions 22 can include body regions, (e.g., body regions 31), source regions (e.g., source regions 33), enhancement regions (e.g., enhancement regions 36), control structures (e.g., control structures 157), link layers (e.g., link layers 26), among other structures. It is further understood that the present embodiments are suitable for planar control structures or planar insulated gate structures as well as trench control structure or trench insulated gate structures. Also, regions 22 are generally illustrated as charge-compensated trenches 22. However, regions 22 may also be charge compensating trenches including one or more compensating layers or regions.

Figure 7:
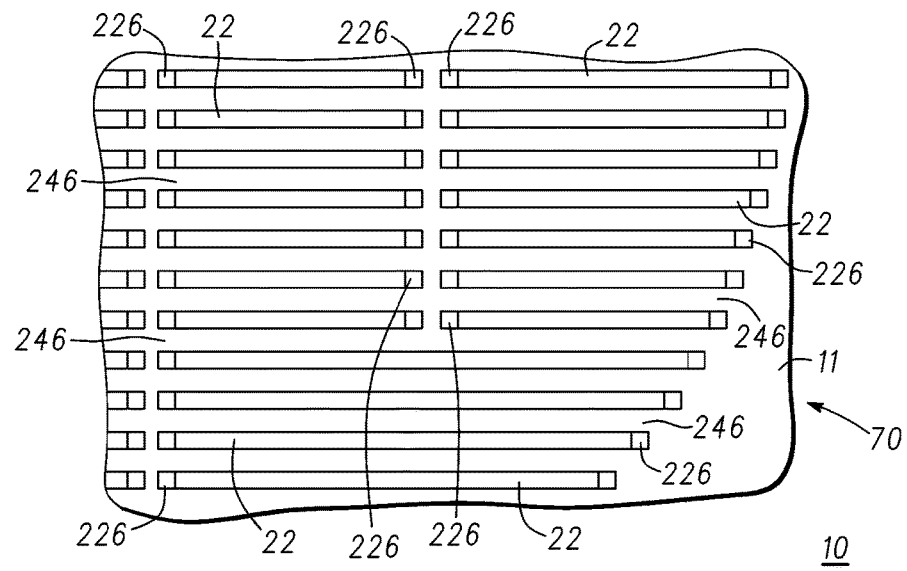
FIGS. 7-13 illustrate partial top views of semiconductor devices having charge-compensated trench structures in accordance with various embodiments of the present invention.

FIG. 7 illustrates a partial top view of an implementation 70 having a plurality of charge-compensated trench structures 22 or regions 22 disposed within region of semiconductor material 11. In one embodiment, implementation 70 is an example of a corner portion of semiconductor device 10. In accordance with one embodiment, charge-compensated trench structures 22 have lengths in a range from about 50 microns through about 100 microns, and some charge-compensated trench structures 22 can have varying lengths. In accordance with the present embodiment, each charge-compensated trench structure 22 has a pair of end portions that are replaced with discrete, individual, or separated structures 226. That is, each structure 226 is separated from adjacent structures 226. In this embodiment, a reduced amount of active semiconductor region or area is removed to form structures 226, which can provide a more optimum Rdson characteristic in some applications.

Figure 8:
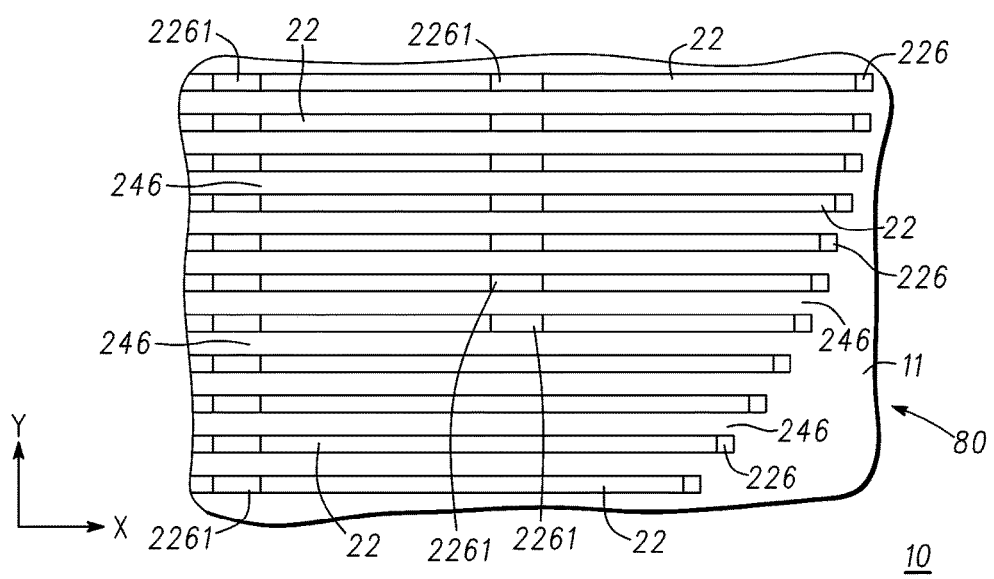

FIG. 8 illustrates a partial top view of an implementation 80 having a plurality of charge-compensated trench structures 22 or regions 22 disposed within region of semiconductor material 11. In one embodiment, implementation 80 is an example of a corner portion of semiconductor device 10. In accordance with the present embodiment, implementation 80 comprises one or more merged structures 2261, which are configured to extend laterally across the active portions of semiconductor device 10 in an x-direction to connect the tips or ends of adjacent charge-compensated trench structures 22. Also, implementation 80 includes structures 226 proximate to tips or ends of charge-compensated trench structures 22 opposite to merged structures 2261. In one embodiment, structures 226 are used proximate to the termination region of semiconductor device 10 and merged structures 2261 are used in the active region of semiconductor device 10. In the present embodiment, merged structures 2261 are disposed to be in generally parallel alignment (e.g., horizontal alignment) with adjacent charged-compensated filled trenches 22 as generally illustrated in FIG. 8. In one embodiment, structures 226 in implementation 80 are disposed proximate to an edge or edge termination region of semiconductor device 10 as will be described in additional detail later.

Figure 9:
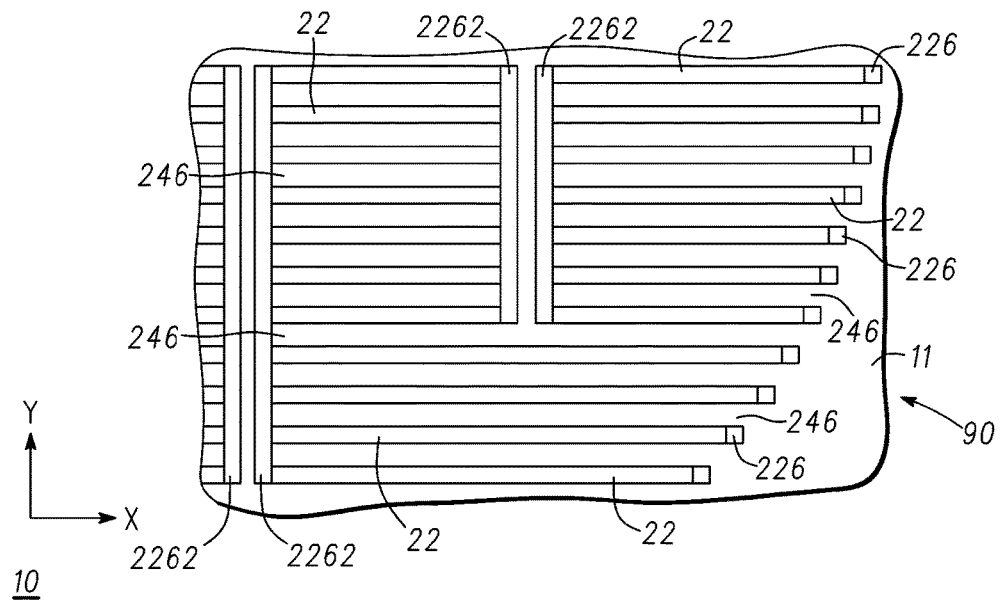

FIG. 9 illustrates a partial top view of an implementation 90 having a plurality of charge-compensated trench structures 22 or regions 22 disposed within region of semiconductor material 11. In one embodiment, implementation 90 is an example of a corner portion of semiconductor device 10. In accordance with the present embodiment, implementation 90 comprises one or more merged structures 2262, which are configured to extend across the active portions of semiconductor device 10 in a y-direction to orthogonally connect the tips or ends of adjacent charge-compensated trench structures 22. Also, implementation 90 includes structures 226 proximate to tips or ends of charge-compensated trench structures 22 opposite to merged structures 2262. In one embodiment, structures 226 are used proximate to the termination region of semiconductor device 10 and merged structures 2262 are used in the active area of semiconductor device 10. In the present embodiment, merged structures 2262 are disposed to be in generally perpendicular alignment with adjacent charged-compensated trench structures 22 as generally illustrated in FIG. 9. In one embodiment, structures 226 in implementation 90 are disposed proximate to an edge termination region of semiconductor device 10. In the present embodiment, discontinuities in the control structure may require structure changes, such as an additional conductive interconnect layer to connect the control structures together.

Figure 10:
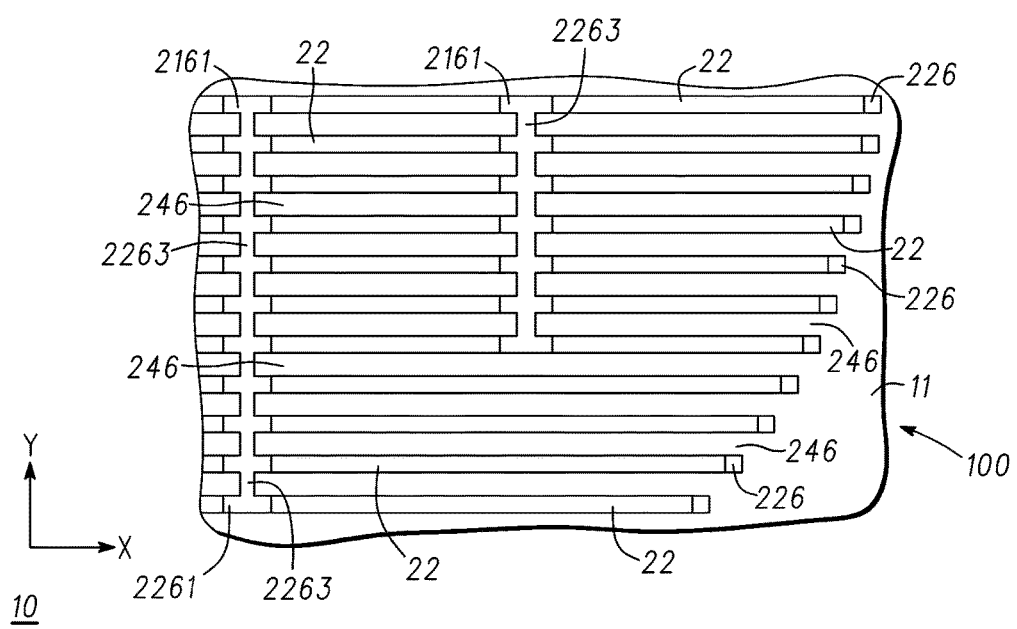

FIG. 10 illustrates a partial top view of an implementation 100 having a plurality of charge-compensated trench structures 22 or regions 22 disposed within region of semiconductor material 11. In one embodiment, implementation 100 is an example of a corner portion of semiconductor device 10. In accordance with the present embodiment, implementation 100 comprises a combination of one or more merged structures 2261, which are configured to extend in an x-direction laterally across the active portions of semiconductor device 10 to connect the tips or end portions of adjacent charge-compensated filled trenches 22, and one or more merged structures 2263, which are configured to extend in a y-direction to orthogonally connect adjacent merged structures 2261. Also, implementation 100 includes structures 226 proximate to tips or ends of charge-compensated trench structures 22 opposite to merged structures 2262. In one embodiment, structures 226 are used proximate to the termination region of semiconductor device 10 and merged structures 2261 and 2263 are used in the active area of semiconductor device 10. In one embodiment, merged structure 2261 and 2263 form a stacked "I" shape in top view as generally illustrated in FIG. 10. In the present embodiment, discontinuities in the control structure may require structure changes, such as an additional conductive interconnect layer to connect the control structures together.

Figure 11:
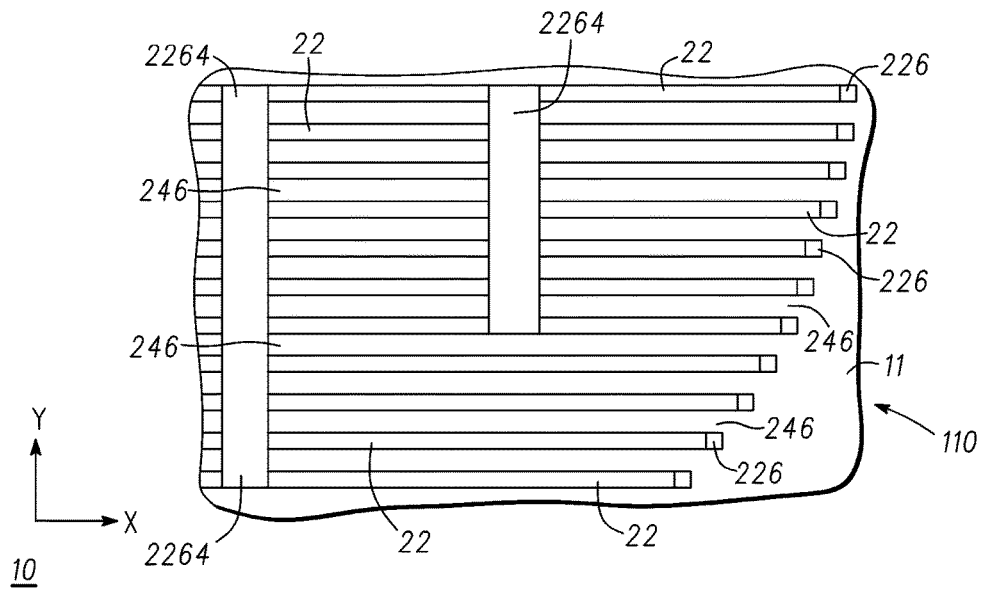

FIG. 11 illustrates a partial top view of an implementation 110 having a plurality of charge-compensated trench structures 22 or regions 22 disposed within region of semiconductor material 11. In one embodiment, implementation 110 is an example of a corner portion of semiconductor device 10. In accordance with the present embodiment, implementation 110 comprises merged structures 2264, which extend between the tips or end portions of adjacent charge-compensated trench structures 22 in both an x-direction and a y-direction. Also, implementation 110 includes structures 226 proximate to tips or ends of charge-compensated trench structures 22 opposite to merged structures 2264. In one embodiment, structures 226 are used proximate to the termination region of semiconductor device 10 and merged structures 2264 are used in the active area of semiconductor device 10. In one embodiment, merged structures 2264 form a rectangular stripe shape in top view as generally illustrated in FIG. 11. In the present embodiment, discontinuities in the control structure may require structure changes, such as an additional conductive interconnect layer to connect the control structures together.

Figure 12:
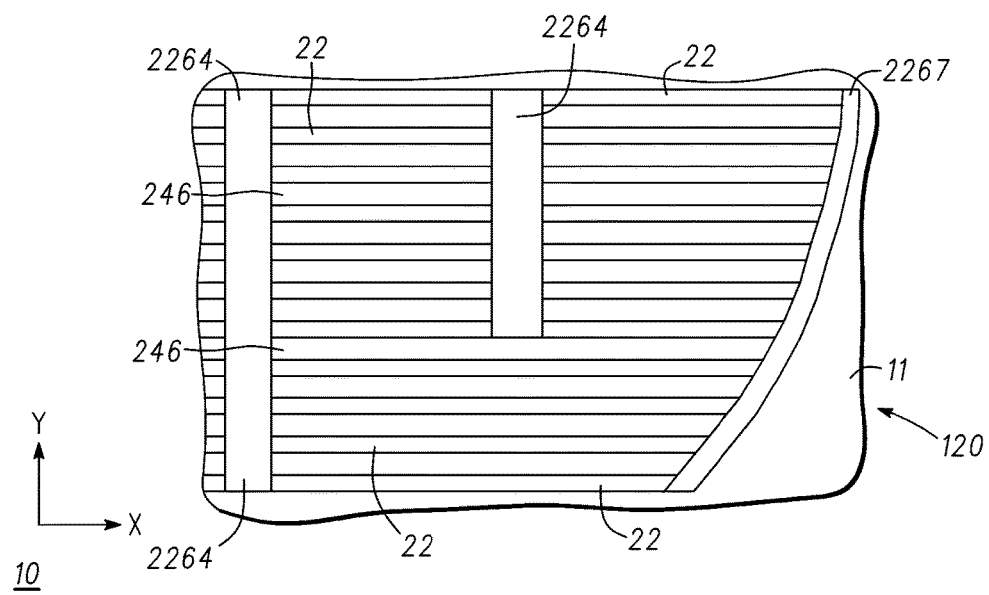

FIG. 12 illustrates a partial top view of an implementation 120 having a plurality of charge-compensated trench structures 22 or regions 22 disposed within region of semiconductor material 11. In one embodiment, implementation 120 is an example of a corner portion of semiconductor device 10. In accordance with the present embodiment, implementation 120 comprises merged structures 2264 as described in implementation 110. Also, implementation 120 includes a merged structure 2267, which extends across the tips or ends portions of adjacent charge-compensated filled trenches 22 proximate to the termination portion of semiconductor device 10 and opposite to merged structures 2264. In one embodiment, merged structure 2267 is used proximate to the termination region of semiconductor device 10 and merged structures 2264 are used in the active area of semiconductor device 10. In the present embodiment, discontinuities in the control structure may require structure changes, such as an additional conductive interconnect layer to connect the control structures together. It is understood that any of the implementations described herein may be used in any combination. Also, it is understood that the tip portions of charge-compensated trench structure 22 in the active area of semiconductor device 10 may be configured differently than the tip portions of charge-compensated filled trenches 22 proximate to the edge termination are of semiconductor device 10.

Figure 13:
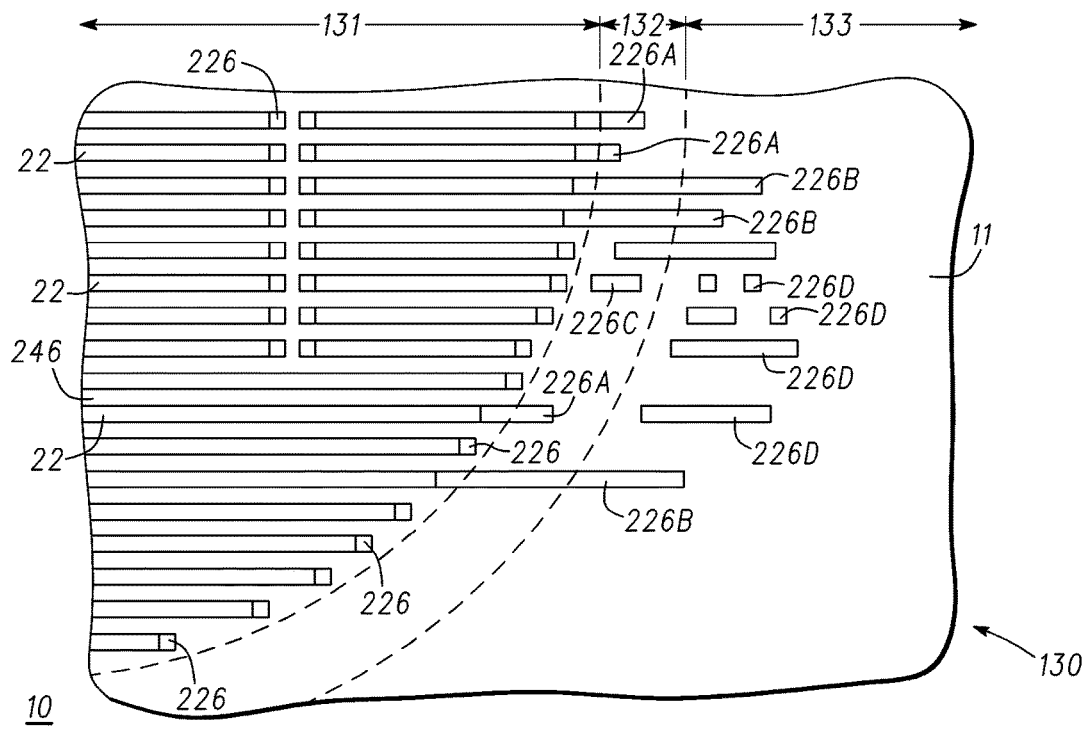

FIG. 13 illustrates a partial top view of an implementation 130 according to a further embodiment. In one embodiment, implementation 130 is an example of a corner portion of semiconductor device 10. In implementation 130, semiconductor device 10 is illustrated to include an active area 131, and termination portion 133 or termination region 133, and a transition region 132 interposed between active area 131 and termination region 133. In accordance with the present embodiment, structures 226 and variations thereof can be disposed at the tips or end portions of charge-compensated trench structures 22 or regions 22, and can further extend into transition region 132 (illustrated as structures 226A) as well as termination region 133 (illustrated as structures 226B). Also, structures 226 can be individually placed within transition region 132 (illustrated as structures 226C) and/or can be individually placed within termination region 133 (illustrated as structures 226D).

Figure 14:
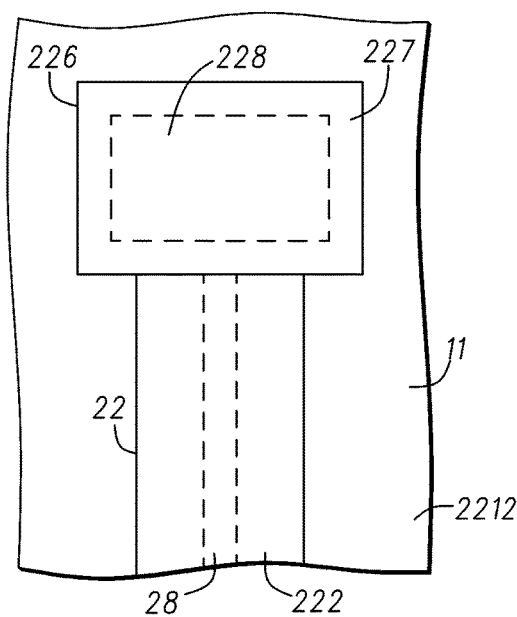
FIG. 14 illustrates a partial top view of a charge compensated structure in accordance with a further embodiment of the present invention.

Although the present embodiments have been illustrated using a local charge-balanced configuration, the present embodiments may be further advantageously used with global charge-balanced configurations where corner features or other structure elements create unwanted charge imbalance(s). For example, FIG. 14 illustrates a partial top view of a charge compensated structure in accordance with a further embodiment. In this embodiment, region 22, charge compensating region 22 or charge compensating trench 22 is provided with a compensating layer 222 that adjoins a conduction layer 2212 or compensating region 2212 provided as part of region of semiconductor material 11. Compensating layer 222 may have the same characteristics (e.g., doping concentration, layer thickness) as described previously and the characteristics (e.g., doping concentration) of conduction layer 2212 may be modified compared to conduction layer 221 to account for the differences in the volume of the conduction region 2212. It is understood that the characteristics of compensating layer 222 may be modified as well. Compensating layer 222 may line trench structure 22 and may further include a dielectric region 28 as described previously. In other embodiments, compensating layer 222 may fill trench structure 22. In accordance with the present embodiment, the structure of FIG. 14 further includes structure 226 configured to address charge imbalance issues associated with the tip portions or tip regions of trench structure 22. In an alternative embodiment, charge compensating region 22 may include one or more diffused regions that form compensating layer 222 or compensating region 222.

From all of the foregoing, one skilled in the art can determine that, according to a further embodiment, a semiconductor device comprises a region of semiconductor material having a major surface. A first charge-compensated trench structure extends from the major surface into the region of semiconductor material to a first depth. The first charge-compensated trench structure includes a first conduction layer of a first conductivity type semiconductor material and a first compensation layer of a second conductivity type semiconductor material opposite to the first conductivity type. A second charge-compensated trench structure extends from the major surface into the region of semiconductor material to the first depth, wherein the second charge-compensated trench structure includes a second conduction layer of the first conductivity type semiconductor material and a second compensation layer of the second conductivity type semiconductor material. A first trench structure is disposed adjoining a first end portion of the first charge-compensated trench structure, wherein the first trench structure comprises a first trench extending from the major surface to a second depth equal to or greater than the first depth and a first material is within the first trench, which is configured to reduce charge-imbalance in the first charge-compensated trench structure. A second trench structure is disposed adjoining a first end portion of the second charge-compensated trench structure. The second trench structure comprises a second trench extending from the major surface to the second depth and a second material is within the first trench, which is configured to reduce charge-imbalance in the second charge-compensated trench structure. A body region of the second conductivity type is disposed in the region of semiconductor material between the first charge-compensated trench structure and the second charge-compensated trench structure. A source region of the first conductivity type is disposed adjacent the body region, and a control structure is disposed adjacent the source and body regions, which is configured to control a channel region within the body region.

In view of all of the above, it is evident that a novel method and structure is disclosed. Included, among other features, the tip portions of charge-compensated trench structures are replaced with a structure that compensates for charge-imbalances created by the structural shapes of the tip portions. The structure may comprises a trench structure that extends the depth of the charge-compensated trench structure and may be further provided with a material liner or filler that is configured not to detrimentally impact the charge balance of the semiconductor device. In some embodiments the material may be one or more dielectric materials and/or a polycrystalline semiconductor material. The structure was found in practice to significantly improve device electrical performance (e.g., BVdss robustness and UIS performance) and to improve manufacturing yields.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, planar gate structure may be used in addition to or in place of trench gate structures. Also, other semiconductor materials in addition to or instead of silicon may be used.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A semiconductor device comprising:
a region of semiconductor material having a major surface and formed with a charge-compensated trench structure extending from the major surface into the region of semiconductor material to a first depth, wherein the charge-compensated trench structure includes a conduction layer of a first conductivity type semiconductor material and a compensation layer of a second conductivity type semiconductor material, and wherein the second conductivity type is opposite to the first conductivity type;
a first trench structure disposed adjoining a first end portion of the charge-compensated trench structure, wherein the first trench structure comprises:
a first trench extending from the major surface to a second depth equal to or greater than the first depth; and
a material within the first trench, wherein the conduction layer and the compensation layer terminate adjoining the material where the first trench structure adjoins the first end portion;
a body region of the second conductivity type disposed in the region of semiconductor material adjacent to the charge-compensated trench structure;
a source region of the first conductivity type disposed adjacent the body region; and
a control structure adjacent the source region and the body region, wherein the control structure is configured to control a channel region within the body region.

2. The device of claim 1, wherein the first trench structure is disposed within an active area of the semiconductor device that is laterally spaced apart from a termination area of the semiconductor device.

3. The device of claim 1, wherein the charge-compensated trench structure comprises outer edges that are generally perpendicular to the first trench structure where the first trench structure adjoins the charge-compensated trench structure.

4. The device of claim 1, wherein the charge-compensated trench structure comprises opposing outer edge segments that are generally straight lines in top view where the outer edge segments adjoin the first trench structure.

5. The device of claim 1, wherein the material comprises a dielectric material.

6. The device of claim 1, wherein the material comprises a polycrystalline semiconductor material.

7. The device of claim 1, wherein the material at least lines a surface of the first trench adjoining the charge-compensated trench structure.

8. The device of claim 1, wherein the first trench structure laterally extends from an active area of the semiconductor device to a termination region.

9. The device of claim 8 further comprising:
a second trench structure disposed adjoining a second end portion of the charge-compensated trench structure, wherein the second trench structure comprises:
a second trench extending from the major surface to the second depth; and
a second material within the second trench;
wherein the second trench structure is disposed within the active area of the semiconductor device but not disposed in the termination region.

10. The device of claim 1, wherein:
the control structure comprises a trench gate structure; and
the semiconductor device further comprises a doped region of the first conductivity type formed spaced apart from the major surface and underlying the body region and extending from a drain end of the channel region to the conduction layer.

11. The device of claim 1 further comprising:
a second charge-compensated trench structure extending from the major surface proximate to the charge-compensated trench structure, wherein:
the first trench structure is further disposed adjoining a second end portion of the second charge-compensated trench structure.

12. A semiconductor device comprising:
a region of semiconductor material having a major surface;
a first region extending from the major surface into the region of semiconductor material to a first depth, wherein the first region comprises a first compensation layer having a first conductivity type;
a second region extending from the major surface into the region of semiconductor material to the first depth, wherein the second region comprises a second compensation layer having the first conductivity type;
a first trench structure disposed adjoining a first end portion of the first region, wherein the first trench structure comprises:
a first trench extending from the major surface to a second depth equal to or greater than the first depth; and
a first material within the first trench, wherein the first compensation layer terminates adjoining the first material where the first trench adjoins the first end portion;
a second trench structure disposed adjoining a second end portion of the second region, wherein the second trench structure comprises:
a second trench extending from the major surface to the second depth; and
a second material within the first trench, wherein the second compensation layer terminates adjoining the second material where the second trench adjoins the second end portion;

a body region of the first conductivity type disposed in the region of semiconductor material between the first region and the second region;

a source region of a second conductivity type opposite to the first conductivity type disposed adjacent the body region; and a control structure disposed adjacent the source and body regions, wherein the trench control structure is configured to control a channel region within the body region.

13. The device of claim 12, wherein the first trench structure and the second trench structure comprise a merged structure.

14. The device of claim 12, wherein:

the first region comprises a first charge-compensated trench structure extending from the major surface into the region of semiconductor material to the first depth and having the first end portion, the first charge-compensated trench structure further comprising a first conduction layer of the second conductivity type; and the second region comprises a second charge-compensated trench structure extending from the major surface into the region of semiconductor material to the first depth and having the second end portion, the second charge-compensated trench structure further comprising a second conduction layer of the second conductivity type.

15. The device of claim 14, wherein the first charge-compensated trench structure and the second charge-compensated trench structure are both absent corner portions.

16. The device of claim 12, wherein:

the first trench structure is disposed within an active area of the semiconductor device;

the second trench structure is disposed within at least an active portion of the semiconductor device; and the semiconductor device further comprises a third trench structure disposed in a termination region of the semiconductor device but not the active area, wherein the third trench structure comprises:

a third trench extending from the major surface; and a third material disposed within the third trench.

17. A method for forming a semiconductor device comprising:

providing a region of semiconductor material having a major surface and a first charge-compensated trench structure extending from the major surface into the region of semiconductor material to a first depth, wherein:

the first charge-compensated trench structure includes a conduction layer of a first conductivity type semiconductor material and a compensation layer of a second conductivity type semiconductor material;

the second conductivity type is opposite to the first conductivity type;

the first charge-compensated trench structure includes a first tip portion having a least one corner portion;

providing a first trench within the region of semiconductor material by removing the first tip portion of the first charge-compensated trench structure such that the first trench adjoins the first charge-compensated trench structure along the first depth;

providing a material within the first trench;

providing a body region of the second conductivity type in the region of semiconductor material adjacent to the first charge-compensated trench structure;

providing a source region of the first conductivity type adjacent the body region; and providing a control structure adjacent the source region and the body region, wherein the control structure is configured to control a channel region within the body region.

18. The method of claim 17, wherein providing the first trench comprises providing the first trench such that opposing outer edge segments of the first charge-compensated trench structure are generally straight lines in top view where the outer edge segments adjoin the first trench.

19. The method of claim 17, wherein:

providing the material comprises providing one or more of a dielectric material or a polycrystalline semiconductor material; and the first trench laterally extends from an active area of the semiconductor device to a termination region.

20. The method of claim 17, wherein:

providing the region of semiconductor material comprises providing a second charge-compensated trench structure extending from the major surface into the region of semiconductor material to the first depth and having a second tip portion having at least one corner portion; and providing the first trench comprises removing the second tip portion of the second charge-compensated trench structure along the first depth.

\* \* \* \* \*